United States Patent [19] [11] 4,254,472
Juengel et al. [45] Mar. 3, 1981

[54] REMOTE METERING SYSTEM

[75] Inventors: Richard O. Juengel, Romeo; Kenneth J. Cook, Troy, both of Mich.

[73] Assignee: The Valeron Corporation, Troy, Mich.

[21] Appl. No.: 933,402

[22] Filed: Aug. 14, 1978

[51] Int. Cl.³ .............................................. H04Q 9/00
[52] U.S. Cl. .................................. 364/900; 340/150; 340/151
[58] Field of Search ... 364/200 MS File, 900 MS File, 364/483, 464, 492, 493; 235/92 EL; 307/31, 35; 340/183, 310 A, 147 R, 177 R, 150, 151, 204; 222/26

[56] References Cited

U.S. PATENT DOCUMENTS

| 3,786,423 | 1/1974 | Martell | 340/151 |
|---|---|---|---|
| 3,820,073 | 6/1974 | Vercellotti et al. | 340/151 |
| 3,899,639 | 8/1975 | Cleveley et al. | 340/150 |
| 4,004,097 | 1/1977 | Spaulding | 340/150 |
| 4,008,458 | 2/1977 | Wensley | 340/150 |
| 4,012,734 | 3/1977 | Jagoda et al. | 340/151 |
| 4,086,434 | 4/1978 | Bocchi | 340/151 |
| 4,107,777 | 8/1978 | Pearson et al. | 222/26 |
| 4,120,031 | 10/1978 | Kincheloe et al. | 364/483 |
| 4,132,981 | 1/1979 | White | 340/150 |
| 4,135,181 | 1/1979 | Bogacki et al. | 340/151 |

Primary Examiner—Felix D. Gruber
Assistant Examiner—Gary Chin
Attorney, Agent, or Firm—Krass & Young

[57] ABSTRACT

A remote metering system for monitoring, collecting, analyzing, transmitting and displaying data generated by a plurality of metering devices. A controller, preferably a microprocessor, stores the continually up-dated data, analyzes it, and initiates transmission of the data to at least one remote data receiving device. The data transmission from the controller is in serial format and includes a plurality of different channels, with at least one channel corresponding to a combination of selected data associated with different metering devices. A scaling factor can be applied to particular metering data prior to transmission, for example, so as to provide cost analyses. The remote data receiving device includes the capability of receiving and displaying data corresponding to any of the output data transmission channels from the controller.

24 Claims, 16 Drawing Figures

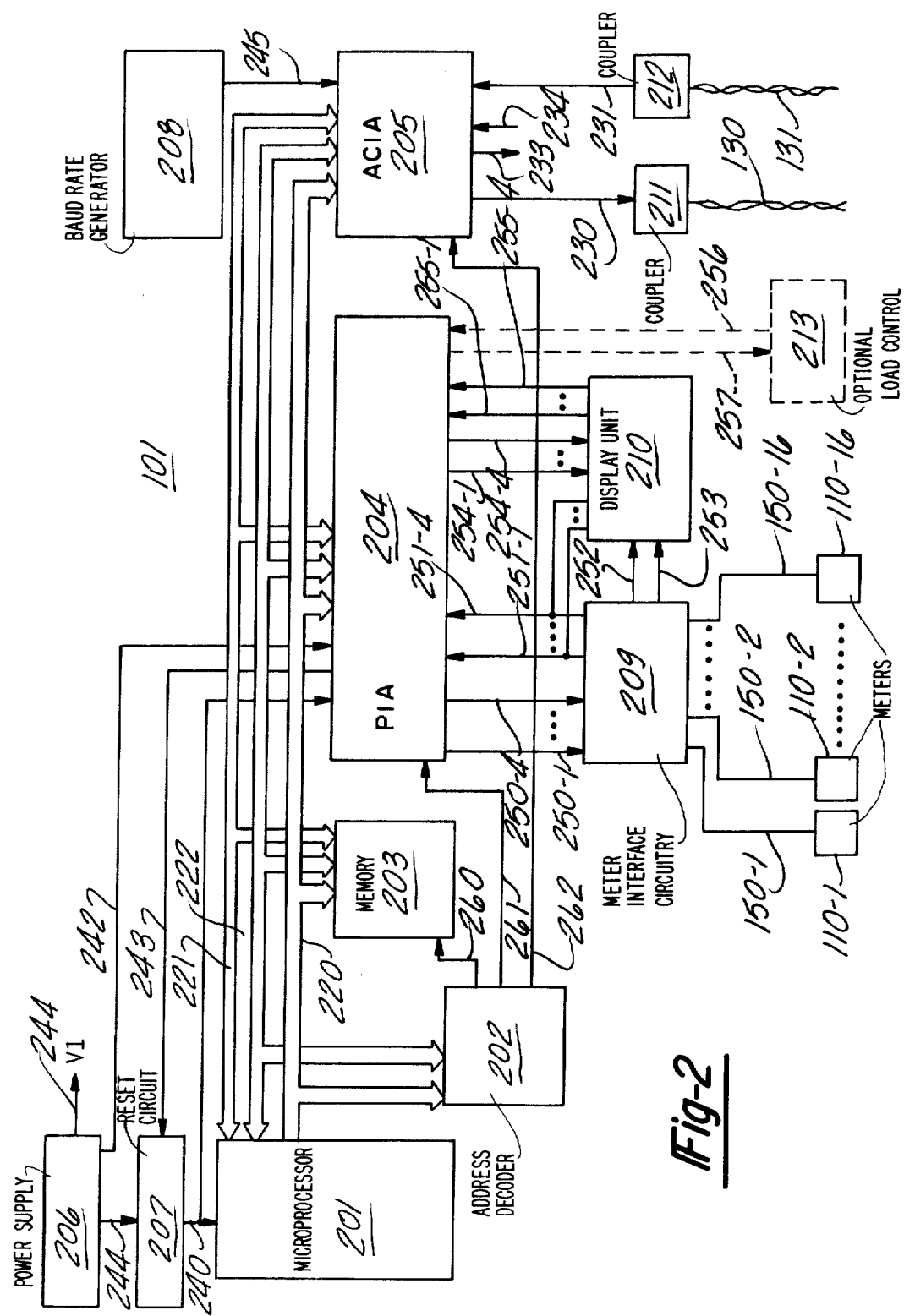

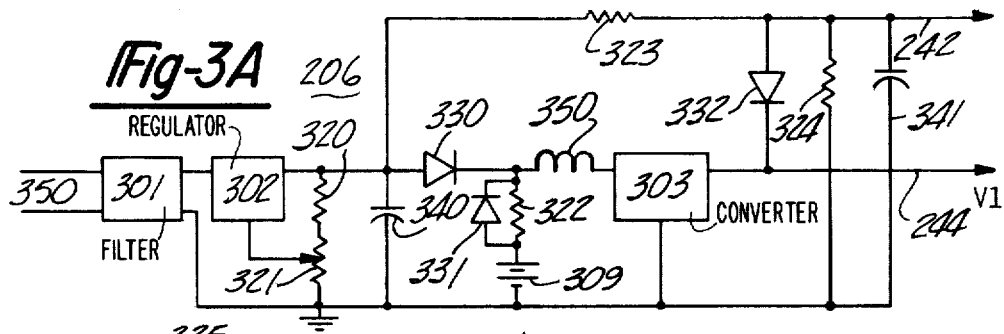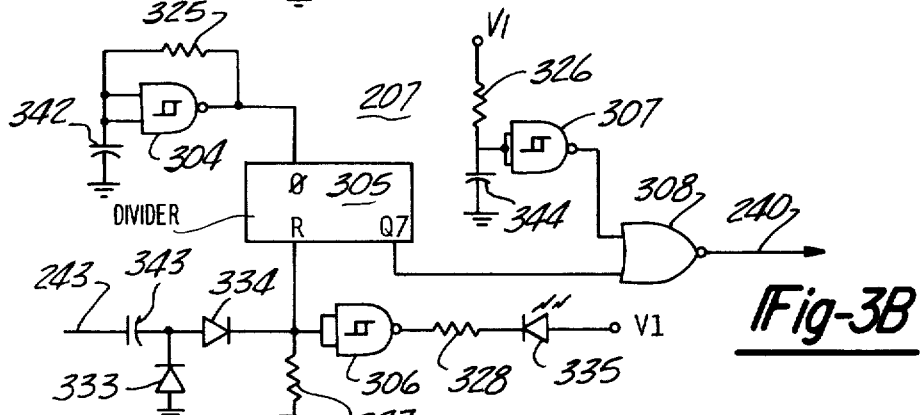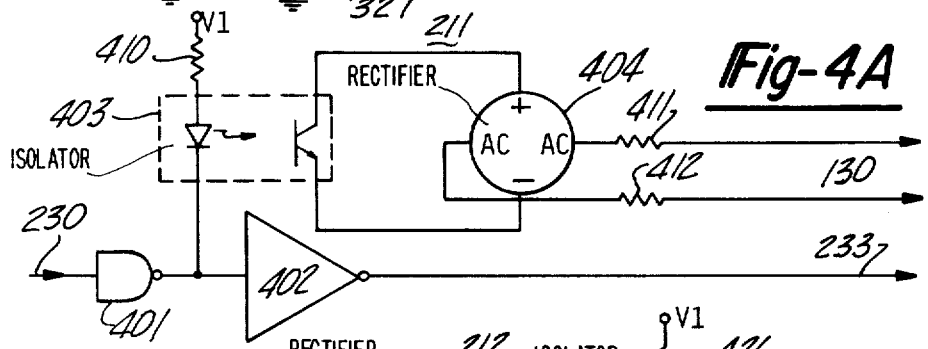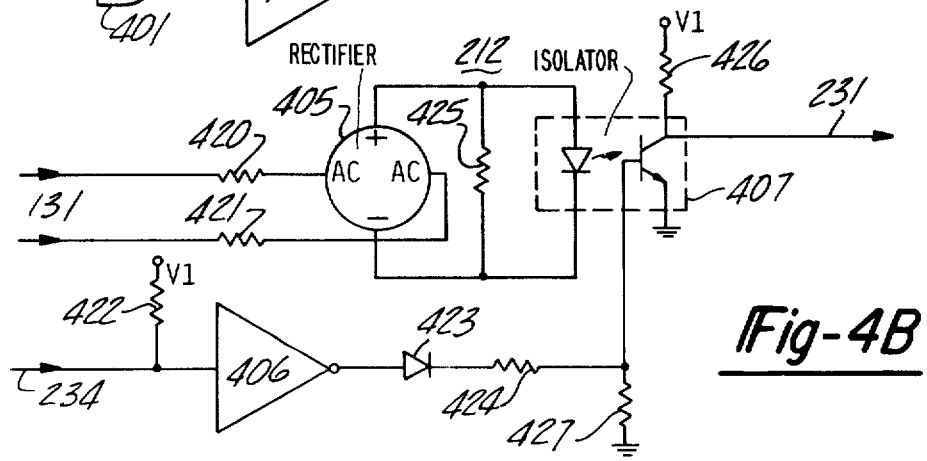

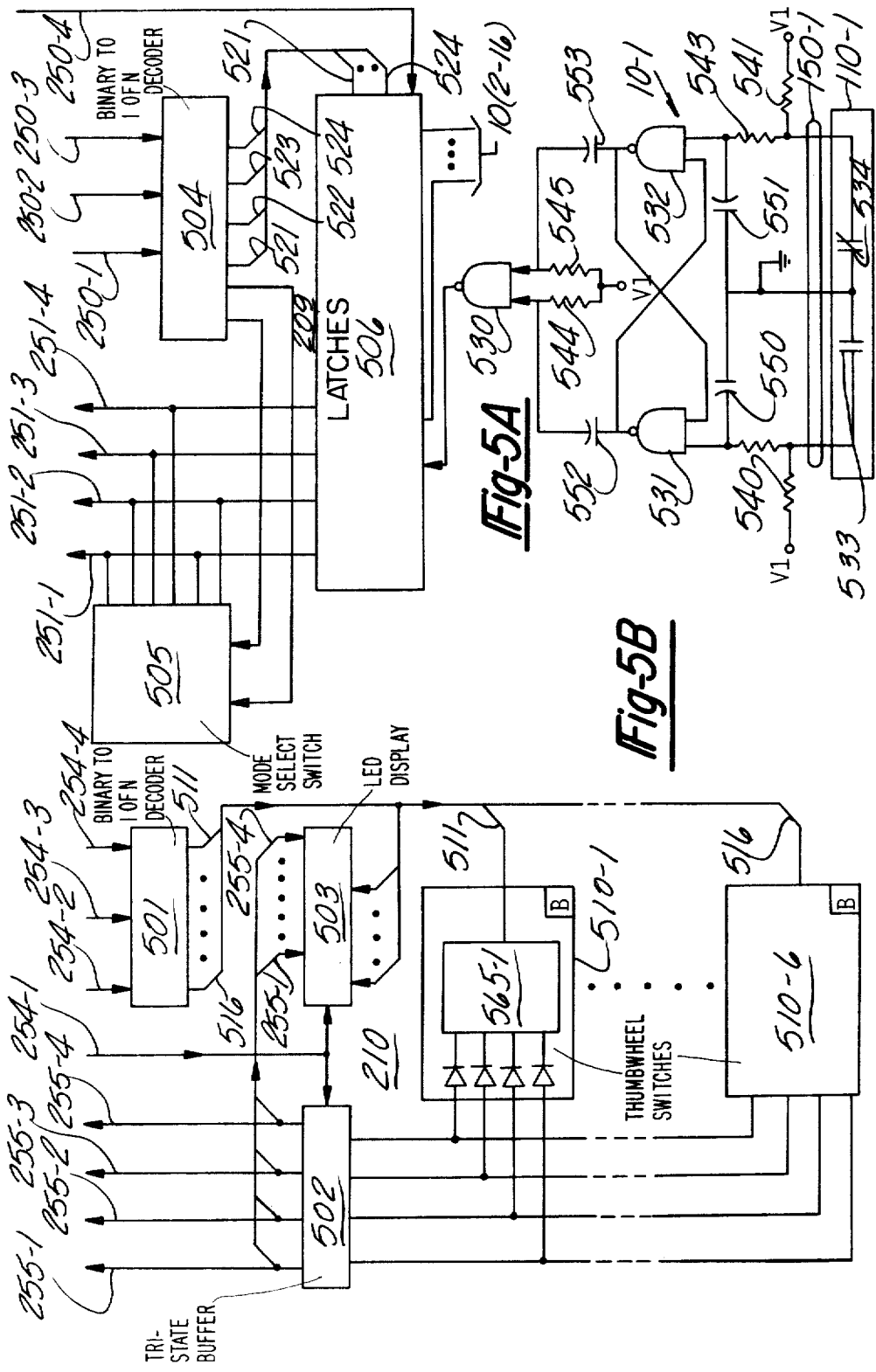

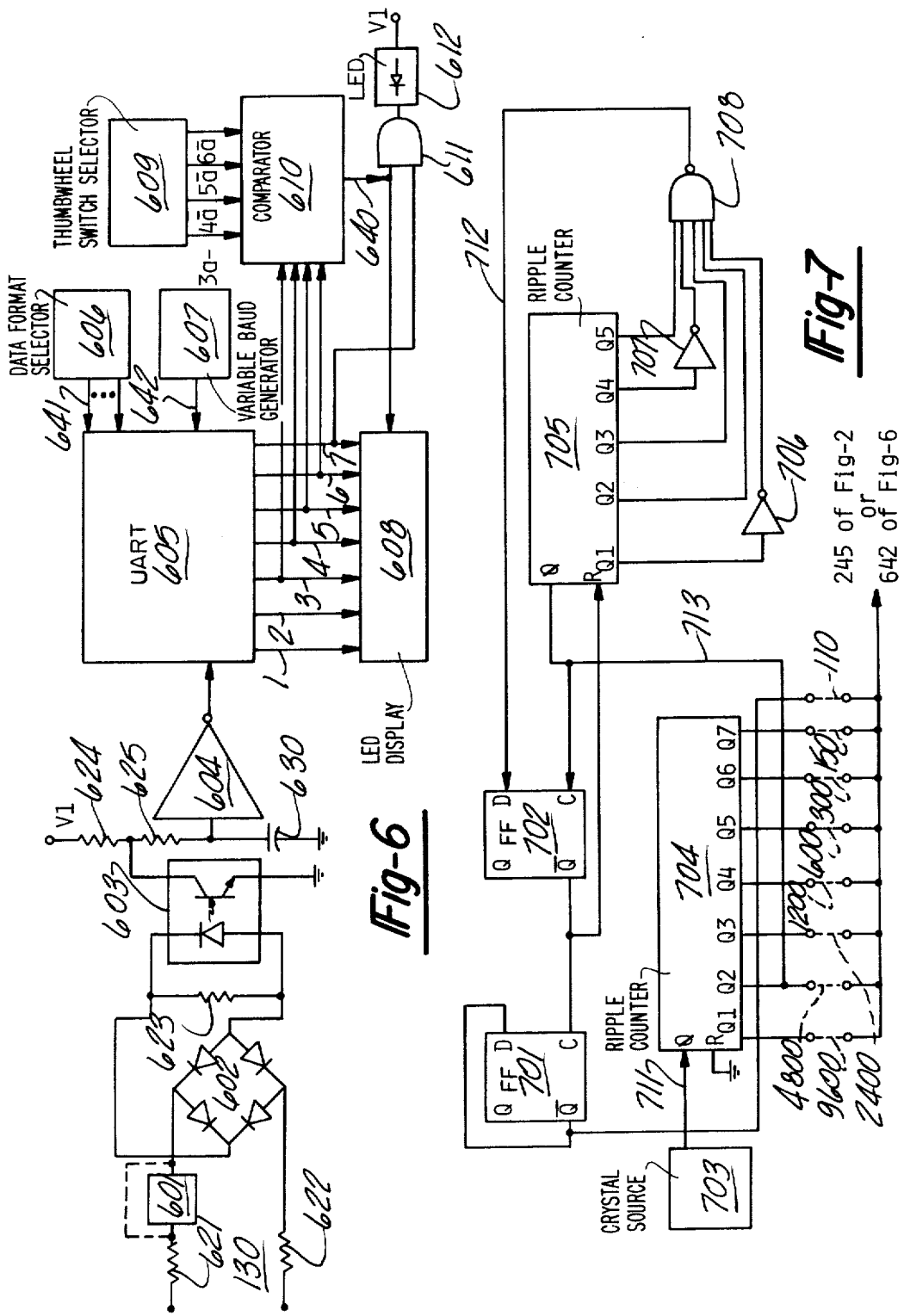

REMOTE METERING SYSTEM

BACKGROUND OF THE INVENTION

This invention relates to remote metering systems. More particularly, it involves a system for receiving data from a plurality of metering devices, analyzing it, and transmitting data associated with such metering devices to remote locations.

The primary use of this invention is in the area of energy management. In such applications, sensors or meters provide an output indicative of the consumption of various energy sources such as electricity, steam, water, gas, etc. Since utility bills are based not only on the total consumption but also on the peak demand within a particular time period, by continually monitoring the energy consumption, non-critical loads can be shed during times of high energy usage to minimize the peak demand and thus utility costs. Examples of commercially available systems include the NUMA-LOGIC Programmable Energy Controller manufactured by Westinghouse Electric Corporation and Veeder-Root's Modular Industrial Data Acquisition System. However, these and other prior art systems have been limited in their abilities to efficiently manage and transmit the data received from the meters. For example, the Veeder-Root system requires a monitor/transmitter for each metering device and merely transmits the same information to a remote display. The Westinghouse system requires plug-in input/output modules for the meters and merely turns selected loads on or off. There is no provision for any data transmission to remote displays. Another similar system is disclosed in U.S. Pat. No. 4,090,088 to McMahon et al, issued May 16, 1978.

There are many other applications for remote metering devices. One such other application is piece counting in a production line environment. A meter provides a signal indicative of a particular unit being completed. This signal is sent to a remote location where the number of units completed is accumulated so that production output can be monitored.

The present invention provides a more flexible and economically efficient improvement over known remote metering systems. It provides the ability to combine data from selected metering devices for transmission to at least one remote data receiving device. For example, all of the electric meters in a plant can be summed together and sent to a display in the manager's office. Moreover, different data transmissions are provided sequentially in serial format and the various remote devices are adapted to receive selected data transmissions, as desired. Consequently, a remote display can receive many different data transmissions without the need for separate wiring connections to each meter.

OBJECTS AND SUMMARY OF THE INVENTION

Therefore, it is an object of this invention to provide an improved remote metering system capable of receiving inputs from a plurality of metering devices and transmitting associated information to remote locations.

It is a further object of this invention to provide a system for combining data associated with a plurality of metering devices and initiating an associated data transmission indicative of such combination.

It is a further object of this invention to provide a remote metering system in which a plurality of different data transmissions are sent to at least one remote data receiving device with the remote device being adapted to selectively receive desired transmissions.

Still another object of this invention is to accomplish the above objectives in an error-free manner with minimal manual intervention.

Briefly, these and other objects of the invention are accomplished through the use of a controller for receiving inputs from a plurality of meters and storing data associated with each meter in a memory. The controller fetches data from selected meters and initiates an output data transmission corresponding to data associated with selected meters. In one embodiment, the controller provides a plurality of different data transmissions or channels, with a remote data receiving device being adapted to receive and display selected channels, as desired. Other features of this invention include serial data transmission of data to a plurality of serially connected remote display devices thereby minimizing wiring costs, an automatic reset circuit for re-initializing the controller upon detection of a failure to progress normally through its programmed functions, and means for detecting primary power source failure, with steps being automatically taken to prolong the life of the secondary source.

BRIEF DESCRIPTION OF THE DRAWINGS

Other features and advantages of this invention will become apparent upon reading the following description and by reference to the accompanying drawings in which:

FIG. 2 is a schematic diagram of one embodiment of the controller for the system of the present invention;

FIG. 3A is a schematic diagram of the power supply circuitry for the controller of FIG. 2;

FIG. 3B is a schematic diagram of a reset timer circuit for the controller of FIG. 2;

FIG. 4A is a schematic diagram of the output loop current signaling transmission circuitry;

FIG. 4B is a schematic diagram of the input loop current signaling transmission circuitry;

FIG. 5A is a schematic diagram illustrating the interface connections between the meters and the controller;

FIG. 5B is a schematic diagram illustrating the controller display unit internal connections;

FIG. 6 is a schematic diagram illustrating one embodiment of the transmission receiving and display circuitry for a remote display utilized in the system of the present invention;

FIG. 7 is a block diagram of the baud generator utilized to establish a transmission rate between the controller and remote data receiving devices;

DESCRIPTION OF THE PREFERRED EMBODIMENT

Figure 1A:
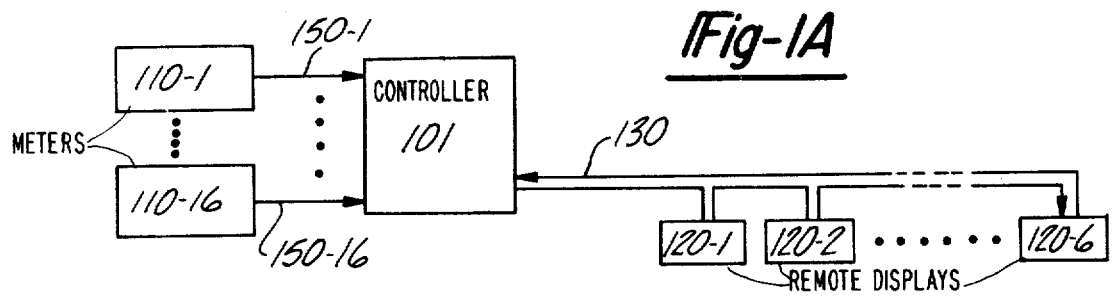
FIGS. 1A–1D are block diagrams illustrating various embodiments of this invention in which a controller provides a communication link between a plurality of metering devices and at least one remote data receiving device.

In order to assist the reader, the drawings have been arranged so that FIG. 1 illustrates the major components of various embodiments of this invention and their interconnections with one another. FIG. 2 illustrates the controller in block diagram form, and the remaining figures show the details of the blocks referenced in FIG. 2. In most instances the first digit of the reference numerals refers to the figure in which the referenced item is illustrated.

Figure 1B:
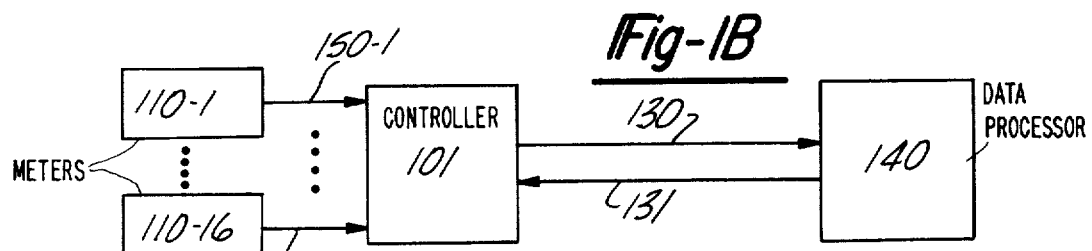
Figure 1C:
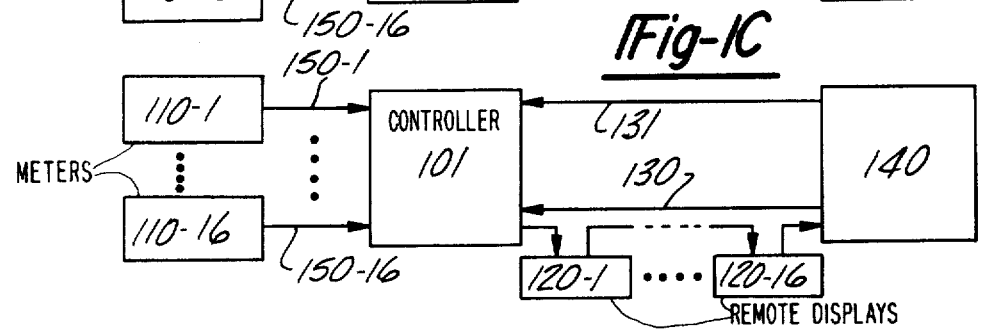
Figure 1D:
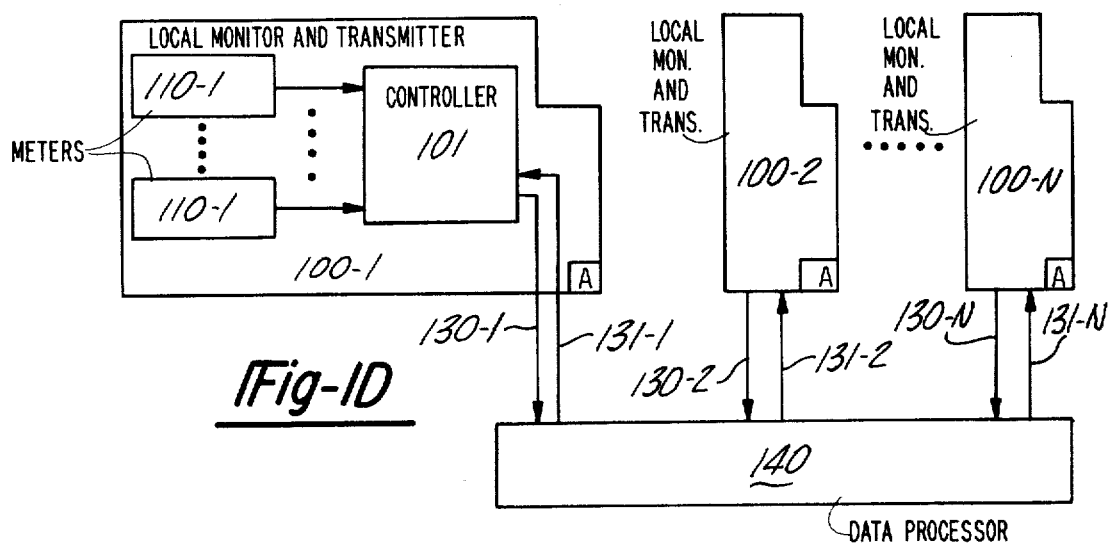

Referring then to FIG. 1A, there is shown one example of the data communication link between a plurality of metering devices 110-1 to 110-6 coupled to a controller 101. Meters 110 can be of a variety of known devices which provide a pulselike output whose frequency is proportional to the quantity being sensed. For example, meters 110 can be utilized to sense the amount of energy used, such as electricity, compressed air, steam, water, natural gas, etc., or they can be used to measure the quantity of pieces completed in a production line environment. As will be more fully discussed herein it is a feature of this invention that controller 101 does more than merely transmit the same information received from the metering devices 110, but is also capable of combining selected meter inputs and supplying an output transmission which is a function of selected inputs. Furthermore it is a feature of the present invention that the system provides output data transmissions in serial format to the data receiving devices. Transmission from controller 101 is made serially in order to more economically transmit the data, minimize the number of wiring connections needed for each display, and eliminate the need for large numbers of expensive input/output ports. In FIG. 1A, the data receiving devices are a plurality of serially connected remote display devices 120. In FIG. 1B, the remote data receiving device comprises a further data processing device 140. For example, device 140 can be a central processor unit of a larger main frame computer which communicates with controller 101 on a time-sharing basis. FIG. 1C illustrates further communication links which includes communication both to remote displays 120 and device 140. FIG. 1D illustrates the data processing device 140 communicating with a plurality of controllers 101. For example, if controllers 101 are utilized for energy management purposes, one such controller can be located in each plant of the manufacturer, with each controller communicating with the central processor unit of the manufacturer at a remote location. Accordingly, device 140 can monitor pertinent data from each plant and provide remote control instructions to each controller system.

The major components of controller 101 are shown in FIG. 2. The metering devices are coupled over lines 150 to meter interface and latch circuitry 209. A peripheral interface adaptor (PIA) 204 provides the necessary interface between circuitry 209 (over lines 250,251) and a display unit 210 (over lines 254,255), and microprocessor 201. Microprocessor 201 is an MC6802 microprocessor and PIA 204 is a 6820 unit, both being manufactured by Motorola Semiconductor. However, they can be a variety of known devices. Microprocessor 201 is instructed by a program stored in memory 203, with an address decoder 202 being utilized as known in the art. Memory 203 can include both Read Only Memory (ROM) and Random Access Memory (RAM) portions. Alternatively, microprocessor 201 may include its own RAM memory.

Power supply 206 supplies power to the necessary controller components including microprocessor 201 through reset circuitry 207. Under control of the stored program, microprocessor 201 monitors the data received from the meters 110 and provides a plurality of output signals in digital form to an Asynchronous Communication Interface Adapter (ACIA) such as the 6850 unit distributed by Motorola Semiconductor Corporation. ACIA 205 receives these signals from microprocessor 201 and converts them into outgoing serial data transmissions over a twisted wire pair 130 via current loop coupler 211. Address bus 220 and bidirectional data 221 and control 222 busses provide internal communcation between microprocessor 201 and decoder 202, memory 203, PIA 204 and ACIA 205 in a manner known in the art. The remote display transmission rate is determined by a baud generator 208. If a data processing device 140 is used to provide remote control instructions to controller 101 over pair 131, a coupler 212, similar to coupler 211, is provided to convert the incoming signal into a compatible level. An optional peripheral device 213 coupled to PIA 204 can be utilized to shed or add loads as instructed by controller 101.

The details of circuitry 209 is shown in more detail in FIG. 5A which includes debounce and signaling conditioning circuits 10 for each meter line 110 thereby removing any extraneous noise from the system. Meters 110 set a latch defined by NAND gates 531, 532 every time a pulse is produced by the meters 110. Microprocessor 201 scans latches 506 by means of PIA 204 on a continual basis. Each time a latch 506 is set, microprocessor 201 stores this information in predetermined address locations in memory 203, such locations being associated with each respective meter device 110. Hence the data supplied by each one of the input channels (defined herein as an input associated with one metering device) is sequentially scanned and accumulated in specified memory locations for subsequent retrieval by microprocessor 201.

Power supply 206 is shown in more detail in FIG. 3A. Line 350 receives external AC power from the usual 115 volt line under normal conditions. Power supply 206, however, also includes battery 309 which is utilized to maintain controller operation for a period of approximately 24 hours in the case that the primary source (i.e. AC line voltage) is not available. Regulator 302 rectifies the AC voltage and provides a charging voltage for battery 309 as well as a supply voltage for a conventional chopping dc/dc convertor 303. Hence, the AC line voltage is regulated to provide the required five volts DC via line 244 for the controller 101 components. In the event that the primary source at line 350 fails, output 242 falls to a zero level which provides an indication of such failure to PIA 204 of FIG. 2 which is detected by microprocessor 201. For example, when battery 309 is supplying power over line 244 instead of the primary source, the resulting zero level on line 242 is detected during periodic scans of PIA 204 by microprocessor 201. As will be discussed, the micro-processor 201 causes the output data transmissions to indicate that the secondary power source is supplying power to the system. Furthermore, internal displays (such as display unit 210) will be disabled in order to conserve battery power.

Referring to FIG. 3B, reset circuit 207 is provided to maintain the automatic operation of the system. Microprocessor 201 operates on command instructions from the stored program in memory 203. Hence, extraneous noise pulses which may cause one of these instructions to be misinterpreted could cause a complete failure of the system. It is a feature of this invention that program instructions are automatically re-initialized if the reset timer 207 is not reset within a predetermined time frame by instructions from microprocessor 201. Binary divider 305 counts clock pulses from an oscillator circuit 304. If a reset pulse is not received from PIA 204 under the control of microprocessor 201 on line 243 within a predetermined time frame, for example, within 64 pulses from oscillator 304, a reset pulse is iniated over line 240. The signal on line 240 instructs microprocessor 201 to re-initialize the program thereby starting the instruction set from a predetermined starting point. Accordingly, no manual intervention is needed to reset the system in the event of spurious noise, etc. However, if the microprocessor 201 is normally performing, it provides a reset pulse to divider 305 within the predetermined time frame, with LED 35 being activated to provide a visual indication of normal operation. Diodes 333 and 334 coupled to input line 243 insure that only pulses and not merely a high level can reset the divider 305. Additionally, if after a failure of both primary and secondary power sources, the power is subsequently established, gate 307 provides a signal to NOR-gate 308 to provide a reset signal on line 240. Consequently, the system is automatically restarted without manual intervention once power is restored.

Controller 101 includes a non-remote display unit 210 located in the same housing (such as a NEMA enclosure) as the controller 101. As shown most clearly in FIG. 5B, display unit 210 includes an LED display 503 and a plurality of thumbwheel switch units 510-1 to 510-6. One of the switch units (switch 510-1, for example) is utilized to select a number associated with one of meters 110. The other five switch units (510-2 through 510-6) are utilized to indicate a five digit data field representation. For example, such a representation may be the current reading of the meter associated with the number selected by switch unit 510-1. A mode select swich 505 of FIG. 5A coupled to PIA 204 provides control instructions to microprocessor 201 indicating the manner in which the input data is to be utilized. In a first or read-out position, mode select switch 505 instructs microprocessor 201 to read the current value stored in memory 203 associated with the meter device indicated on unit 510-1 and cause LED display 503 to indicate such value. In a second or preset position, mode select switch 501 causes microprocessor 201 to store the data field representation indicated by switch units 510-2 through 510-6 into a memory location associated with the metering device designated by switch unit 510-1. Furthermore, display unit 503 is activated to reflect the up-dated value just entered for the chosen meter. It should be noted that an additional feature of this invention is that when the secondary power source or battery 309 of FIG. 3A is supplying power to controller 101, the signal indicating such on line 242 causes display 503 to be disabled via path 254-1 from PIA 204 thereby conserving battery power to maintain the stored data in memory 203.

Figure 8A:
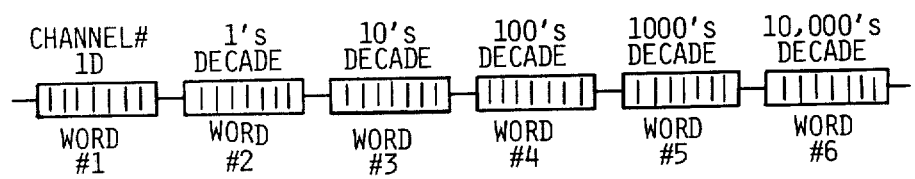
FIGS. 8A and 8B illustrate the format for outgoing data transmissions from the controller.
Figure 8B:
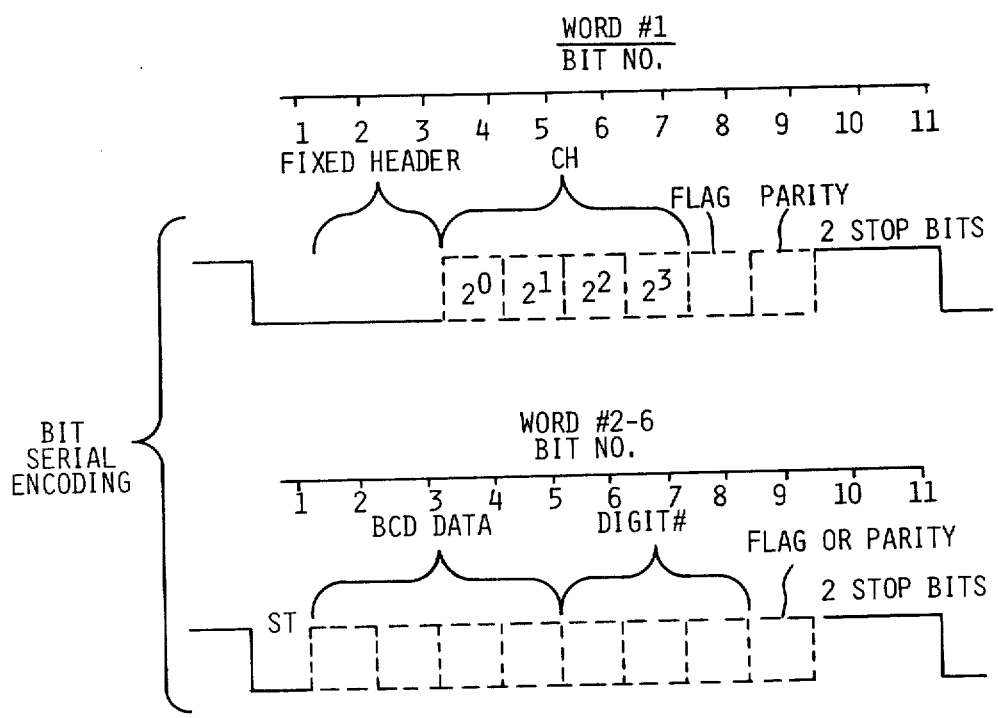

During operation of the system, microprocessor 201 initiates a series of data transmissions through ACIA 205. The data is transmitted in serial fashion such that several distinct channels of information are successively transmitted to remote data receiving devices. The data transmission channels do not necessarily correspond to the data received by the input channels from the metering devices 110. In fact, as will later be discussed, at least one of the data transmission channels will provide data associated with selected ones of the metering device input data. Consequently, the number of output channels may exceed the number of meter inputs. In this embodiment where a plurality of remote display devices 120 are utilized (see FIG. 1A), each data transmission channel takes the form as shown in FIG. 8A. FIG. 8A discloses the format for a complete frame of channel data transmission. In this embodiment, the 8 of 11 ASCII teletype format is used in which each word is preceeded by one start bit and ends with two stop bits. Word No. 1 comprises a channel identification word with the subsequent five words providing data for a five digit display. Hence, bit No. 1 is the start bit for word No. 1 (See FIG. 8B). The next two bits of word No. 1 represent a fixed header comprising a nonvalid BCD number, for example, by setting these bits to logical one. The next four bits represent channel identification signals. Bit No. 8 is reserved for a flag indicating that the secondary source of power is being utilized. Bit No. 9 is a parity bit, with bits 10 and 11 providing stop bits. Words 2-6 provide sufficient information to communicate with any five-digit display in the remote unit. Hence, each data transmission or frame comprises a channel identification word and five consecutive data words to activate the remote display.

The ACIA 205 thus converts the data from microprocessor 201 into bit serial format for outpulsing the data transmission along line 230. As shown most clearly in FIG. 4A, a loop current signaling circuit 211 provides these transmissions as a series of changing current levels defining the respective data bits. Circuit 211 utilizes an optical isolator 403 to minimize noise. Rectifier 404 takes account of the bipolar nature of the phototransistor in isolator 403 and provides a serial output along twisted pair 130 to the remote displays 120. Line 233 provides an optical TTL signal output directly from ACIA 205.

A variable baud generator shown in detail in FIG. 7 is utilized both in controller 101 (as indicated by functional block 208 of FIG. 2) and in the remote display 120 (as indicated by functional block 607 of FIG. 6) to synchronize the data transmission rate. The baud generators utilized in this invention are well known in the art and comprise a base crystal clock source 703, as well as 7-bit ripple counters 704, 705 to provide the transmission rate. The use of jumper wires on the output of counter 704 determines the baud rate used in the data transmission.

FIG. 6 shows the details of one embodiment of a remote display 120. The data transmissions from controller 101 over line 130 are applied to a universal asynchronous receiver/transmitter (UAR/T) 605, such as a 6402 unit, through an optical isolator circuit 603. A thumb wheel switch selector 609 is utilized to select the data transmission channel desired to be displayed upon a five digit LED display 608. Selector 609 is coupled to a comparator 610 which compares the channel identification signal (e.g. bits 4–7 of the first word in the frame) upon receipt of each data transmission. If there is coincidence, the display is enabled and displays the data associated with that particular channel. For example, assume that channel 16 is desired to be selected, then the number 16 is entered into switch selector 609 and supplied to an input of comparator 610. For each channel of data transmission that is received by UAR/T 605, the channel identification word is interrogated and the succeeding data is displayed only if there is coincidence therebetween. Other channels can be similarly selected. Each remote display unit 120 functions identically.

Hence, each remote display unit has the capability of addressing any of the data transmission channels. It should also be noted that if the secondary power source flag has been set in the channel identification word (e.g. bit No. 8 is a logical one) a visual indicator such as LED 612 is lighted, thereby indicating to the user at a remote location that the primary power source has failed. UAR/T 605 converts the succeeding data words (e.g. 2-6) into a predetermined format for use by display 608 so as to provide an alphanumeric representation of the data contained therein.

If the system is used with a central computer system such as data processor 140 shown in FIGS. 1B, 1C and 1D, then serial data input can be received over line 131 from such central computer system. The serial input is also a current loop signal which is converted to a TTL level voltage signal compatible with the ACIA 205 of controller 101. This is accomplished through circuit 212 shown in FIG. 4B. Hence, the second loop current signaling transmission is coupled to the input of optical isolator 407 which supplies the compatible signal to ACIA 205 over line 231. Alternatively, a TTL compatible signal can be coupled directly to ACIA 205 over line 234.

The central data processing system 140 can provide a variety of control instructions to controller 101. For example, the data processor 140 may request that the monitored data in memory 203 be dumped out to processor 140 serially over the output line 130. PIA 204 can also be utilized to function as an input/output port (over lines 256,257) in which loads 213 are acquired or shed in response to commands from the central processing device 140. A variety of other remote control instructions can be readily envisioned.

Figure 9:
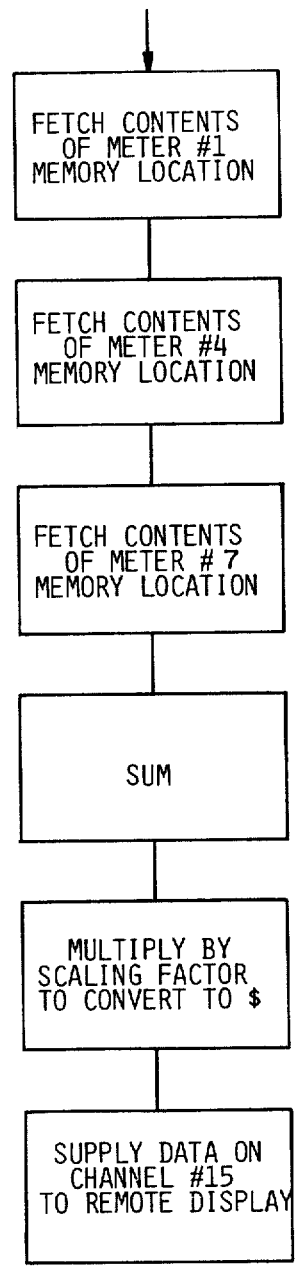
FIG. 9 is a flow chart illustrating the sequence of steps of one example of a program stored in the controller memory for providing a particular data transmission.

A variety of control programs can be envisioned to adapt the microprocessor 201 to provide certain data as a function of a plurality of metering device inputs 110. In FIG. 9 there is shown a flow chart of such a program providing an output transmission on one channel which indicates the cost of the electricity being used in an entire plant. For purposes of this example assume that there are ten meters 110 in the plant and are coupled to controller 101. However, only meters Nos. 1, 4 and 7 are monitoring electricity whereas the remaining meters are monitoring other energy sources such as water, gas etc. Assume further that controller 101 provides 16 distinct output transmission channels to a remote display 120 in the plant manager's office, with channel No. 15 being predetermined as carrying total plant electricity cost information. Then, at the appropriate time in the program, it instructs microprocessor 201 to fetch the contents of the data associated with meters 1, 4 and 7 from memory 203. The data from all three meters are then summed together. Unfortunately, this sum may represent only the total kilowatt/hour usage. However, it is a feature of this invention that a scaling factor has been previously stored in memory 203. In this example, the scaling factor represents the dollar cost per kilowatt/hour. This scaling factor is fetched from memory 203 and is used to multiply the previous sum of the meters. Microprocessor 201 then causes the product (representing the total cost of electricity usage) in digital form to be sent to ACIA 205 which transmits the data to the remote display as words 2-6 following a preceeding channel identification word denoting channel No. 15. The manager then selects channel No. 15 via switch 609 causing the dollar amount to be shown in display 608.

A variety of other pertinent data can be similarly supplied over other channels. For example, "pseudometering" can be performed when the total energy consumption is monitored and it is known that a particular machine utilizes a predetermined percentage of the total consumption. In that case the total consumption is multiplied by a scaling factor representing the percentage, to provide a transmission on one channel indicating the energy usage of that particular machine even though only the total consumption has been monitored.

It can now be realized that the present invention provides not only more flexibility than prior art devices, but that it provides this advantage at minimal cost and is truly an automatic system which requires little manual intervention once the system has been installed. While the present invention has been described in connection with specific examples thereof as required by law, it is not intended to be construed as being limited to such examples since obvious modifications can be readily envisioned by a person skilled in the art. Instead the scope of the present invention should be defined by the appended claims.

The embodiments of the invention in which an exclusive property or privilege is claimed are defined as follows:

1. A remote metering system for use with a plurality of meters, said system comprising:
   a local housing containing control means having a plurality of inputs respectively coupled to the outputs of said meters, memory means for storing data, means coupled to said inputs for storing data associated with each meter in predetermined locations in said memory, means for retrieving data associated with predetermined meters from the memory, means for combining said retrieved data prior to transmission so as to provide an output signal as a function of a combination of selected ones of said meters, and interface means for preparing said output signal as one of a plurality of subsequent serial data transmissions; and
   remote data receiving means spaced a distance from the local housing and coupled to the control means via the interface means, operative for receiving said transmissions so that said remote data receiving means receives data which is at least a function of a combination of selected ones of said meters.

2. The system of claim 1 wherein said control means further includes:
   at least one scaling factor stored in said memory, means for retrieving said scaling factor from the memory, and means for applying the scaling factor to the data associated with at least one of the selected metering devices prior to transmission.

3. The system set forth in claim 1 wherein said remote data receiving means further includes a display means for providing a visual indication of the received transmission.

4. The system of claim 3 wherein the remote data receiving means further comprises:
   means for displaying an alphanumeric representation of said received transmission, and means for converting the received transmission into a predetermined format for use by the display means in providing the alphanumeric representation.

5. The system of claim 1 wherein the remote data receiving means comprises:
   a data processing device including means for collecting and analyzing the data from the control means, means for generating remote control instructions, and means for coupling the generated remote control instructions to the control means.

6. The system of claim 4 which further comprises:
a plurality of serially connected remote display means connected to said interface means by one communication line, said control means providing a coded identification signal preceeding each of a plurality of different outgoing data transmissions, with each display means including a decoder means for interpreting said identification signal so as to discriminate between different transmissions.

7. The system of claim 6 wherein said decoder means further comprises:
a comparator;
a manually adjustable transmission selector means providing an input to the comparator, said comparator having another input for receipt of said identification signal, whereby said comparator provides an enabling output signal to said display means when the inputs to said comparator coincide.

8. The system of claim 1 further comprising:
manually adjustable clock signal generating means coupled to the interface means operative to define a transmission rate for the interface means; and
manually adjustable clock signal generating means in the remote data receiving means operative to determine a data reception rate.

9. The system of claim 1 wherein the interface means comprises:
means for serially outpulsing the signals from the control means;
optical isolator means coupled to said means for serially outpulsing; and
loop current signaling transmission means coupling an output of the isolator means to the remote data receiving means.

10. The system of claim 5 wherein the interface means comprises:
means for serially outpulsing the signals from the control means;
means for serially receiving remote control instruction from the data processing device;
first optical isolator means having an input coupled to the means for serially outpulsing;
second optical isolator means having an output coupled to the means for serially receiving;
first loop current signaling transmission means coupled between the input of the second optical isolator means and the data processing device and
second loop current signaling transmission means coupled between the output of the first optical isolator means and the data processing device.

11. The system of claim 1 further comprising:
primary and secondary sources of power;
detection means for generating a particular output signal when said secondary source is supplying system power; and
means for coupling the detection means to the control means.

12. The system of claim 11 further comprising:
means for supplying in said transmission to the remote data receiving means a signal indicative of said secondary source supplying system power as detected by the detection means;
means in the remote data receiving means for sensing the presence of such signal; and means for providing a visual indication that said secondary source is supplying the power to the system when said signal is sensed.

13. The system of claim 11 further comprising:
local display means driven by the same power supply as the control means;
first manually adjustable switch means coupled to the control means and having a plurality of positions, each position associated with a particular meter;
second manually adjustable switch means coupled to the control means and having a plurality of positions, each indicative of a different data field representation;
third manually actuable switch means coupled to the control means, operative in a first position to cause the control means to provide a visual indication on the display means of the data in said memory associated with the meter selected by said first switch means, and operative in a second position to cause the control means to read the data field represented by the second switch means and store that data at a memory location associated with the meter selected by the first switch means.

14. The system of claim 13 which further comprises:
means for disabling said display means upon detection of said secondary power source supplying power to the system.

15. The system of claim 1 which further comprises:
a program stored in the memory for instructing said control means;
a reset circuit means including a pulse generator for providing pulses of a predetermined frequency;
said control means providing a reset signal to said reset circuit as said control means progresses through various instructions of the program; and
said reset circuit means providing a signal to said control means to re-initialize said program if said reset pulse is not received within a predetermined number of pulses.

16. A remote metering system for monitoring and transmitting data associated with energy usage as sensed by at least one pulse generating meter device, said system comprising:
a local microcomputer based controller including a memory means for storing pulse data associated with the metering device and at least one scaling factor, means in the local controller for generating a plurality of distinctive output signals, with at least one of the output signals being the result of analyzing the meter pulse data in the memory as a function of said scaling factor prior to transmission, a remote display, means in the local controller for transmitting said output signals in the form of a plurality of serial data transmissions over one line to said remote display, and means in said remote display for receiving and displaying selected ones of said serial data transmissions whereby a user at the same location as the remote display may be informed of a variety of information relating to energy usage.

17. The system of claim 16 which further comprises an asynchronous communication interface means for preparing the controller output signals for subsequent transmission to the remote display, with said controller means providing said interface means with a coded signal for identifying each of the plural of data transmissions, with the remote display including a selection device for providing a signal associated with the particular transmission desired to be received, comparator means for comparing said identification signal in each of the transmissions and said selection signal, and means for displaying the contents of the received transmission only if there is coincidence between the selection and identification signals.

18. The system of claim 17 which further comprises:
   means for receiving data from a plurality of metering devices;
   means for combining data associated with two or more metering devices; and
   means for supplying an output data transmission associated with said combined data to said remote display.

19. The system of claim 18 which further comprises a plurality of serially connected remote displays.

20. A remote metering system for use with a plurality of meters, said system comprising:
   a single microcomputer based control means having a plurality of inputs respectively coupled to the output of said meters, memory means for storing data including at least one scaling factor, means coupled to said inputs for storing data associated with each meter in predetermined locations in said memory, means for retrieving data associated with predetermined meters from the memory and analyzing it as a function of the scaling factor, interface means for providing a plurality of different outgoing data transmissions associated with selected data retrieved from said memory, said control means providing a coded identification signal preceeding each of said outgoing data transmissions; and
   a plurality of serially connected remote display means connected to said interface means by one communication line, with each display means including a decoder means for interpreting said identification signal so as to discriminate between different transmissions whereby each of the remote display means may display data associated with selected transmissions.

21. The system of claim 20 wherein said decoder means further comprises:
   a comparator;
   manually adjustable transmission selector means providing an input to the comparator, said comparator having another input for receipt of said identification signal, whereby said comparator provides an enabling signal to said display means to provide a visual indication of the data associated with the particular transmission when the inputs to the comparator coincide.

22. A controller for a remote metering system for monitoring a plurality of meters, said controller comprising:
   control means having a plurality of inputs respectively coupled to the outputs of said meters, memory means for storing data, means coupled to said inputs for storing data associated with each meter in predetermined locations in said memory, means for retrieving data associated with selected meters from the memory, interface means for providing a plurality of output data transmissions containing data associated with selected meters to a remote data receiving device, said controller further including a power source, local display means driven by the same power source as the control means, first manually adjustable switch means coupled to the control means and having a plurality of positions, each position associated with a particular meter, second manually adjustable switch means coupled to control means and having a plurality of positions, each position of the second switch means being indicative of a different data field representation, third manually actuable switch means coupled to the control means, operative in a first position to cause the control means to provide a visual indication on the local display means of the data in said memory associated with the meter selected by said first switch means, and operative in a second position to cause the control means to read the data field represented by the second switch means and store that data at a memory location associated with the meter selected by the first switch means.

23. The controller of claim 22 which further comprises:
   primary and secondary sources of power; and
   means for disabling said local display means upon detection of said secondary power source supplying power to the controller.

24. A controller for a remote metering system for monitoring a plurality of meters, said controller comprising:
   control means having a plurality of inputs respectively coupled to the outputs of said meters, memory means for storing data and a program for instructing said control means, means coupled to the inputs for storing data associated with each meter in predetermined locations in said memory, means for retrieving data associated with selected meters from the memory, interface means for providing output data transmissions associated with selected meter data to a remote data receiving device, said controller further including reset circuit means having a pulse generator for providing pulses of a predetermined frequency, said control means providing a reset signal to said reset circuit as said control means progresses through various instructions of the program, and said reset circuit means providing a signal to said control means to reinitialize said program if said reset signal is not received within a predetermined number of pulses.

* * * * *